United States Patent
Matoba

(10) Patent No.: US 7,324,027 B2
(45) Date of Patent: Jan. 29, 2008

(54) CIRCUIT AND METHOD FOR TESTING ANALOG-DIGITAL CONVERTER

(75) Inventor: Kenjiro Matoba, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 10 days.

(21) Appl. No.: 11/415,149

(22) Filed: May 2, 2006

(65) Prior Publication Data

US 2006/0261990 A1    Nov. 23, 2006

(30) Foreign Application Priority Data

May 17, 2005    (JP)    ............................. 2005-143795

(51) Int. Cl.
*H03M 1/10*    (2006.01)
(52) U.S. Cl. ...................... 341/119; 341/120
(58) Field of Classification Search ......... 341/115–155
See application file for complete search history.

(56) References Cited

U.S. PATENT DOCUMENTS 5,150,121 A * 9/1992 Newell et al. ............... 341/157
5,856,799 A * 1/1999 Hamasaki et al. .......... 341/118

FOREIGN PATENT DOCUMENTS

JP    11-326465    11/1999

* cited by examiner

*Primary Examiner*—Lam T. Mai
(74) *Attorney, Agent, or Firm*—Nixon Peabody LLP; Donald R. Studebaekr

(57)    ABSTRACT

A circuit for testing an analog-digital converter includes: a subtracter which receives a converted value having a plurality of bits outputted from the analog-digital converter and an expected value having a plurality of bits, the subtracter calculating a difference value having a plurality of bits between the converted value and the expected value; and a logical operation circuit which receives the difference value, the logical operation circuit performing an exclusive-NOR operation between adjacent bits in the plurality of bits constituting the difference value, thereby outputting an exclusive-NOR value having a plurality of bits.

12 Claims, 6 Drawing Sheets

CIRCUIT AND METHOD FOR TESTING ANALOG-DIGITAL CONVERTER

BACKGROUND OF THE INVENTION

1. Field of the Invention

The present invention relates to a circuit and method for testing an analog-digital converter (ADC).

2. Description of the Related Art

FIG. 9 is a block diagram for explaining a method for testing an ADC 11 in a conventional large scale integrated (LSI) circuit 500 which includes the ADC 11 and an internal logic circuit 12 operating according to an output from the ADC 11. When the LSI circuit 500 tests the performance of the ADC 11, an analog input signal $A_{IN}$ is inputted through an input terminal to the ADC 11, and output terminals (i.e., MONITOR terminals), to which a 16-bit output signal from the ADC 11 is inputted, are monitored to judge the performance of the ADC 11.

FIG. 10 is a block diagram for explaining another method for testing an ADC 11 in another conventional LSI circuit 600 which includes the ADC 11 and an internal logic circuit 12 operating according to an output from the ADC 11. When the LSI circuit 600 tests the performance of the ADC 11, an external digital-analog converter (DAC) is connected to output terminals of the ADC 11, an analog input signal $A_{IN}$ is inputted through an input terminal to the ADC 11, and an output terminal (i.e., MONITOR terminal) of the DAC 21 is monitored to judge the performance of the ADC 11. See Japanese Patent Application Kokai (Laid-Open) Publication No. 11-326465 (Patent Document 1), for example.

However, in the conventional testing method by the LSI circuit 500 shown in FIG. 9, it is difficult to judge the performance of the ADC 11 in consideration of a conversion error of the ADC 11, in particular, a conversion error around zero-crossing or digit-carrying. More specifically, when pass/fail decision is made on 8-bit data in 2 s complement form with 1-LSB (least significant bit) error permitted, only first 7 bits are cared in the decision.

When an expected value of an output from the ADC 11 is "00000000" and a tolerable error is 1-LSB, not only a converted value "00000000" but also converted values "00000001" and "11111111" should be determined as pass results. Although setting an LSB as a "Don't Care" bit (which means that any bit value is permitted) allows the converted value "00000001" to be determined as pass result, there is a problem that the converted value "11111111" is difficult to be determined as pass result.

In the conventional testing method by the LSI circuit 600 shown in FIG. 10, an analog output signal produced by the DAC 21 is monitored. However, it is a problem that measurement result varies according to accuracy of the DAC 21 and an accurate decision of the performance of the ADC 11 cannot be obtained. There is another problem that time for testing increases because the DA conversion in the DAC 21 takes much time.

SUMMARY OF THE INVENTION

It is an object of the present invention to provide a circuit and method for testing an ADC accurately and quickly.

According to an aspect of the present invention, a circuit for testing an analog-digital converter, includes: a subtracter which receives a converted value having a plurality of bits outputted from the analog-digital converter and an expected value having a plurality of bits, the subtracter calculating a difference value having a plurality of bits between the converted value and the expected value; and a logical operation circuit which receives the difference value, the logical operation circuit performing an exclusive-NOR operation between adjacent bits in the plurality of bits constituting the difference value, thereby outputting an exclusive-NOR value having a plurality of bits.

According to another aspect of the present invention, a circuit for testing an analog-digital converter, includes: a delay circuit which receives a converted value having a plurality of bits outputted from the analog-digital converter, the delay circuit delaying the converted value, thereby outputting a delayed converted value having a plurality of bits; and a comparator which receives the delayed converted value outputted from the delay circuit and the converted value outputted from the analog-digital converter, the comparator comparing the delayed converted value and the converted value, thereby outputting a check signal having a level based on whether the converted value is greater than the delayed converted value or not.

According to a further aspect of the present invention, a method for testing an analog-digital converter, includes the steps of: inputting an analog input signal to the analog-digital converter, thereby causing the analog-digital converter to output a converted value having a plurality of bits; calculating a difference value having a plurality of bits between the converted value outputted from the analog-digital converter and an expected value having a plurality of bits generated by an expected value generator; and performing an exclusive-NOR operation between adjacent bits in the plurality of bits constituting the difference value, thereby outputting an exclusive-NOR value having a plurality of bits.

According to a yet further aspect of the present invention, a method for testing an analog-digital converter, includes the steps of: inputting an analog input signal to the analog-digital converter, thereby causing the analog-digital converter to output a converted value having a plurality of bits; delaying a converted value outputted from the analog-digital converter, thereby outputting a delayed converted value having a plurality of bits; and comparing the delayed converted value outputted from the delay circuit and the converted value outputted from the analog-digital converter, thereby outputting a check signal having a level based on whether the converted value is greater than the delayed converted value or not.

In the present invention, the difference between a converted value having a plurality of bits outputted from an analog-digital converter and an expected value having a plurality of bits is calculated to obtain a difference value having a plurality of bits, an exclusive-NOR operation is performed between adjacent bits in the difference value, and thus pass/fail decision in the analog-digital converter is performed on the basis of the exclusive-NOR value. Therefore, the present invention has an advantage that accurate and quick pass/fail decision can be made, even if a tolerable error of the analog-digital converter relative to the expected value is 1-LSB.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
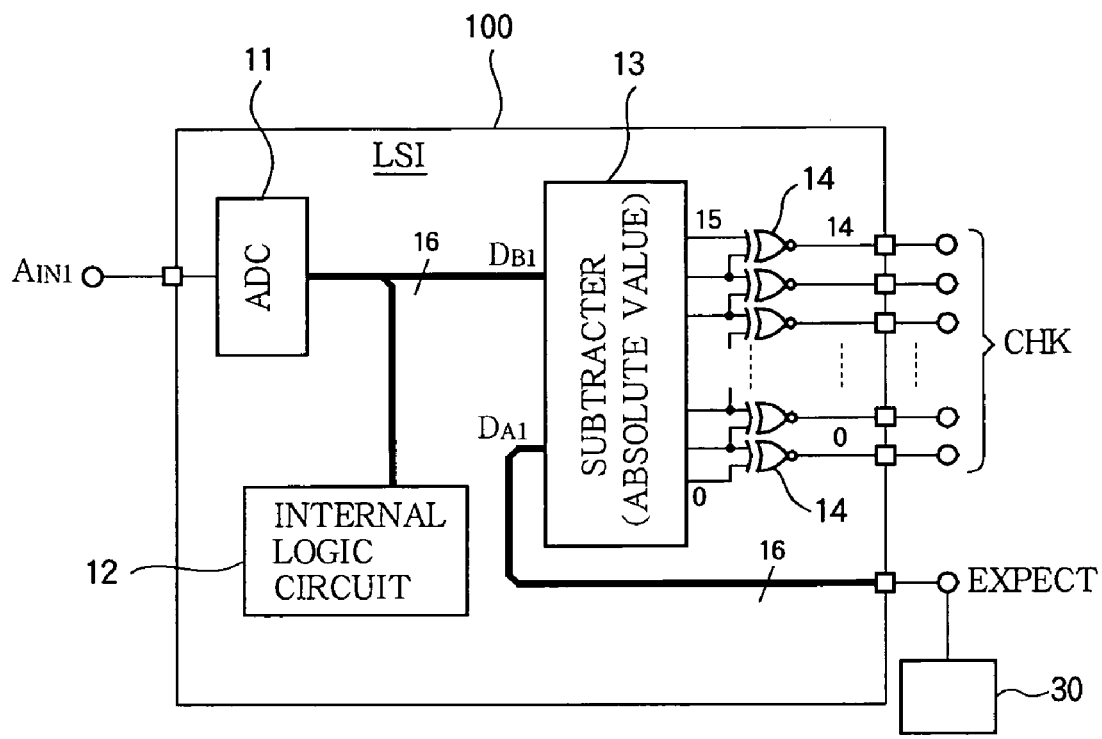
FIG. 1 is a block diagram showing an LSI circuit including a testing circuit according to the first embodiment of the present invention (i.e., a testing circuit which can perform a testing method according to the first embodiment)

FIG. 1 is a block diagram showing an LSI circuit 100 which includes a testing circuit according to the first embodiment of the present invention (i.e., a circuit which can perform a testing method according to the first embodiment).

As shown in FIG. 1, the LSI circuit 100 includes an ADC 11 which converts an analog input signal $A_{IN1}$ to a digital signal (i.e., a converted value) $D_{B1}$ having a plurality of bits (e.g., 16 bits) and an internal logic circuit 12 which operates according to the converted value $D_{B1}$ outputted from the ADC 11. The LSI circuit 100 also includes a subtracter 13 which calculates an absolute value (i.e., a subtraction output value) $|D_{B1}-D_{A1}|$ of a difference between the converted value $D_{B1}$ outputted from the ADC 11 and an expected value $D_{A1}$ having a plurality of bits (e.g., 16 bits), which is outputted from an external device 30 through an EXPECT terminal. The LSI circuit 100 further includes an exclusive-NOR (ENOR) circuit which includes a plurality of ENOR gates 14. The ENOR circuit (i.e., the ENOR gates 14) performs an exclusive-NOR operation between adjacent bits in the plurality of bits (e.g., 16 bits) constituting the subtraction output value $|D_{B1}-D_{A1}|$ which is outputted from the subtracter 13. In the first embodiment, the number of the ENOR gates 14 is fifteen. The subtracter 13 and the ENOR gates 14 constitute the testing circuit of the ADC 11. The expected value $D_{A1}$ is a digital signal having a plurality of bits (e.g., 16 bits) and corresponds to the analog input signal $A_{IN1}$ inputted to the ADC 11. Although FIG. 1 shows that the elements 11 to 14 are formed in a single LSI circuit, the subtracter 13 and the ENOR gates 14 constituting the testing circuit can be an external device which is separated from the LSI circuit having the ADC 11 and the internal logic circuit 12.

The converted value $D_{B1}$ outputted from the ADC 11 is inputted to the subtracter 13 and at the same time, the expected value $D_{A1}$ is inputted to the subtracter 13 through the EXPECT terminal. The subtracter 13 calculates the absolute value (i.e., the subtraction output value having a plurality of bits) of the difference between the converted value $D_{B1}$ outputted from the ADC 11 and the expected value $D_{A1}$. Adjacent bits in the plurality of bits constituting the subtraction output value are inputted to the ENOR gates 14 respectively, as shown in FIG. 1. Each of the ENOR gates 14 outputs HIGH level to the CHK terminals when the adjacent bits agree, and outputs LOW level to the CHK terminals when the adjacent bits do not agree.

Figure 2:
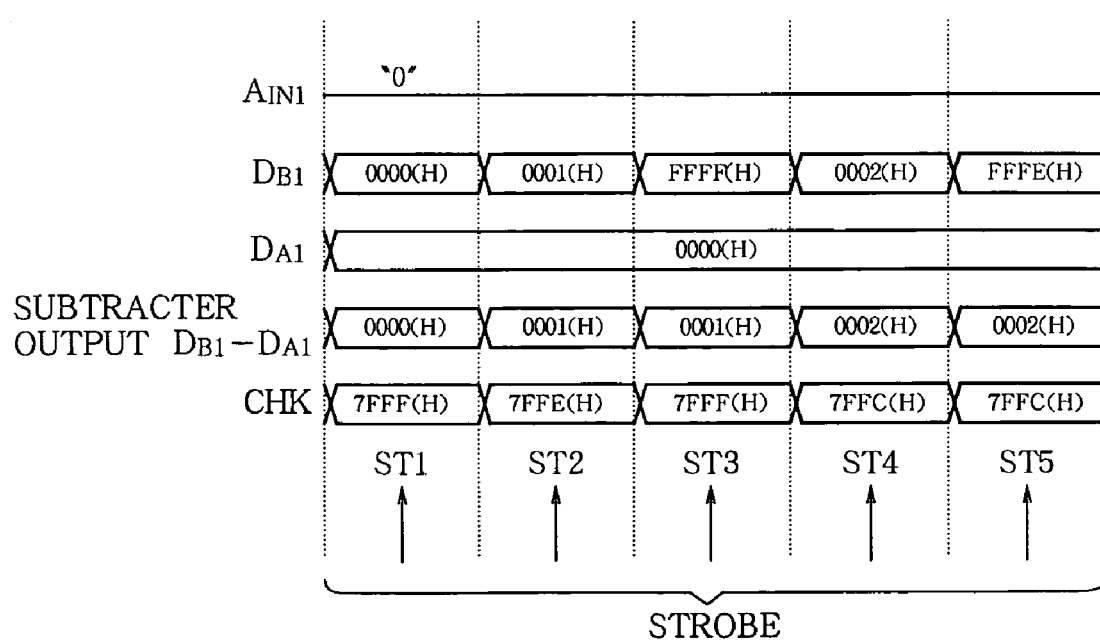
FIG. 2 is a timing chart for explaining operation in the testing circuit according to the first embodiment (i.e., the testing method according to the first embodiment)

FIG. 2 is a timing chart for explaining operation of the testing circuit according to the first embodiment (i.e., the testing method according to the first embodiment). In FIG. 2, Strobes ST1 to ST5 indicate timings of monitoring an AD-converted signal (i.e., a converted value outputted from the ADC 11). In this description, binary numbers are put in double quotation marks (" "), and hexadecimal numbers are marked with (H).

With reference to FIG. 2, operation will be described with reference to a case where a zero-level voltage as an analog input signal $A_{IN1}$ is inputted to the ADC 11 and the converted value $D_{B1}$ outputted from the ADC 11 exhibits variations such as 0000(H), 0001(H), FFFF(H), 0002(H), and FFFE(H), where a 1-LSB conversion error is permitted in the ADC 11 by the specification. An expected value 0000(H) which corresponds to the zero-level analog input signal $A_{IN1}$ is inputted to the subtracter 13 through the EXPECT terminal. Accordingly, if the converted value $D_{B1}$ outputted from the ADC 11 is any of values 0000(H), 0001(H), and FFFF(H), it is determined as a pass result. On the other hand, if the converted value $D_{B1}$ outputted from the ADC 11 is any of values 0002(H) and FFFE(H), it is determined a fail result.

When the converted values $D_{B1}$ outputted from the ADC 11, to which the analog input signal $A_{IN1}$ with a zero-level voltage is inputted, are 0000(H), 0001(H), FFFF(H), 0002(H), and FFFE(H), the subtracter output values outputted from the subtracter 13 are 0000(H), 0001(H), 0001(H), 0002(H), and 0002(H) respectively, as shown in the timing chart of FIG. 2. The CHK terminals receive and outputs a result of determination whether adjacent bits in the subtracter output value outputted from the subtracter 13 agree or not (i.e., exclusive-NOR), such as 7FFF(H), 7FFE(H), 7FFE(H), 7FFC(H), and 7FFC(H), as shown in the timing chart of FIG. 2.

If an expected value of the CHK terminals (e.g., 15 bits) is "111111111111111", where x indicates a "Don't Care" bit, the converted values $D_{B1}$ outputted from the ADC 11, 0000(H), 0001(H), and FFFF(H) having an error within 1-LSB are determined as pass results, while the converted values $D_{B1}$, 0002(H) and FFFE(H) having a 2-LSB error are determined as fail results.

As has been described above, according to the testing circuit or testing method according to the first embodiment, accurate pass/fail decision can be made with respect to all converted values outputted from the ADC 11 without using an external circuit. Also, test time can be shortened because a test can be performed at the same speed as the AD-conversion speed of the ADC 11.

Second Embodiment

Figure 3:
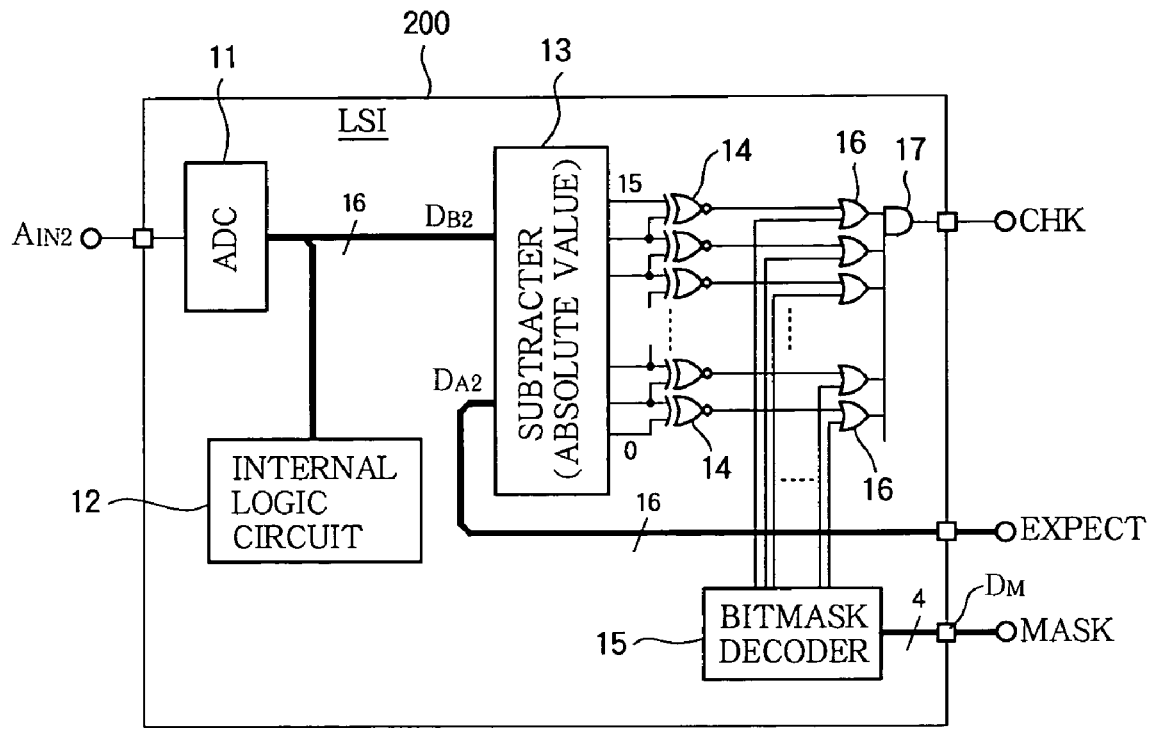
FIG. 3 is a block diagram showing an LSI circuit including a testing circuit according to the second embodiment of the present invention (i.e., a testing circuit which can perform a testing method according to the second embodiment)

FIG. 3 is a block diagram showing an LSI circuit 200 which includes a testing circuit according to the second embodiment of the present invention (i.e., a circuit which can perform a testing method according to the second embodiment). In FIG. 3, the same reference symbols denote the same or corresponding elements in FIG. 1.

The testing circuit according to the second embodiment differs from that of the first embodiment in the following point. The testing circuit according to the second embodiment includes a bitmask decoder 15 which outputs a mask value having a plurality of bits according to a mask signal $D_M$ inputted through a MASK terminal from an external circuit (not shown in the figure). The testing circuit also includes a logical sum circuit which includes a plurality of OR gates 16 and performs a logical sum operation between output values from the ENOR gates 14 and the output values from the bitmask decoder 15. The testing circuit further includes a logical product circuit which includes an AND gate 17 and performs a logical product operation of the output values from the OR gates 16. The bitmask decoder 15 produces the mask value having a plurality of bits. The mask value can include HIGH level bits. The number, which is counted from the LSB, of the HIGH level bits corresponds to the mask signal $D_M$ inputted to the bitmask decoder 15 through the MASK terminal. For example, when a 4-bit 5(H) signal is inputted through the MASK terminal to the bitmask decoder 15, the bitmask decoder 15 outputs a signal having HIGH level in the lower five bits, i.e., "0000000000011111". An output of the AND gate 17 is connected to a CHK terminal.

Figure 4:
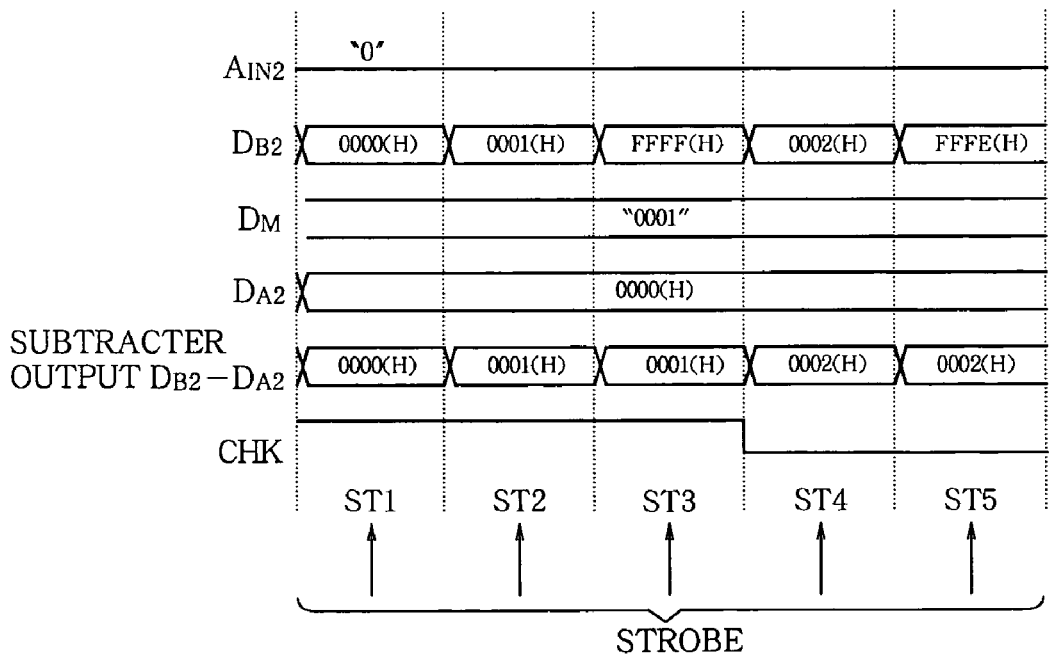
FIG. 4 is a timing chart for explaining operation in the testing circuit according to the second embodiment (i.e., a testing method according to the second embodiment)

FIG. 4 is a timing chart for explaining operation of the testing circuit according to the second embodiment (i.e., the testing method according to the second embodiment). In FIG. 4, Strobes ST1 to ST5 indicate timings of monitoring an AD-converted signal (i.e., a converted value outputted from the ADC 11).

With reference to FIG. 4, operation will be described with reference to a case where a zero-level voltage as an analog input signal $A_{IN2}$ is inputted to the ADC 11 and the converted values $D_{B2}$ having a plurality of bits outputted from the ADC 11 exhibits variations such as 0000(H), 0001(H), FFFF(H), 0002(H), and FFFE(H), where a 1-LSB error is permitted in the ADC 11 by the specification. An expected value 0000(H) which corresponds to the zero-level analog signal is inputted through the EXPECT terminal to the subtracter 13. Accordingly, the converted values 0000(H), 0001(H), and FFFF(H) outputted from the ADC 11 are determined as pass results. On the other hand, the converted values 0002(H) and FFFE(H) outputted from the ADC 11 are determined as fail results.

The MASK terminal is supplied with a mask signal $D_M$ "0001" as the number of a "Don't Care" bit. The subtracter 13 outputs an absolute value $|D_{B2}-D_{A2}|$ of a difference between the converted value $D_{B2}$ having a plurality of bits and being outputted from the ADC 11 and an expected value $D_{A2}$ having a plurality of bits (e.g., 16 bits) and being inputted from an external device through an EXPECT terminal. The exclusive-NOR circuit (i.e., the ENOR gates 14) performs an exclusive-NOR operation between adjacent bits in the subtraction output value $|D_{B2}-D_{A2}|$ having a plurality of bits (e.g., 16 bits) and being outputted from the subtracter 13. Then, the OR gate 16 receiving the agreed bits outputs HIGH level, and other OR gate 16 receiving the bits which do not agree outputs LOW level. In this case, an output of the bitmask decoder 15 has HIGH level in the bit or bits which are set as a "Don't Care" bit. Therefore, input values (i.e., output values of the ENOR gates 14) of the OR gates 16 which do not receive a "Don't Care" bit are valid. If all the bits are HIGH level, the CHK terminal is HIGH level, which means a pass result.

When the ADC 11, to which a zero-level voltage as the analog input signal $A_{IN2}$ is inputted, outputs the converted value $D_{B2}$, 0000(H), 0001(H), FFFF(H), 0002(H) and FFFE (H), the subtracter 13 outputs the subtraction output value 0000(H), 0001(H), 0001(H), 0002(H), and 0002(H), as shown in the timing chart of FIG. 4. A result of determination whether adjacent bits in the subtraction output value of the subtracter 13 agree or not (i.e., exclusive-NOR) are inputted to the OR gates 16 (not shown in FIG. 4; it is the same as the CHK output shown in FIG. 2) and then outputs 7FFF(H), 7FFE(H), 7FFE(H), 7FFC(H), and 7FFC(H) are obtained. The MASK terminal is supplied with "0001", and therefore the bitmask decoder 15 outputs a 15-bit signal "000000000000000", with HIGH level in the LSB.

Since the bitmask decoder 15 has the LSB of the OR gates fixed to HIGH level, data other than the LSB of the OR gates 16 are valid for input values to the AND gate 17.

Accordingly, signals HIGH, HIGH, HIGH, LOW, and LOW in that order are outputted to the CHK terminal, as shown in FIG. 4. When HIGH indicates a pass result and LOW indicates a fail result, the converted values 0000(H), 0001(H), and FFFF(H) having an error within 1-LSB are determined as pass results while the converted values 0002 (H) and FFFE(H) having a 2-LSB error are determined as fail results.

As has been described above, in addition to the advantage of the first embodiment, according to the testing circuit or the testing method according to the second embodiment in which a single CHK terminal is used, the tolerable error in the ADC 11 can be variably set and the number of test terminals can be reduced.

The second embodiment is the same as the first embodiment except for the points described above.

Third Embodiment

Figure 5:
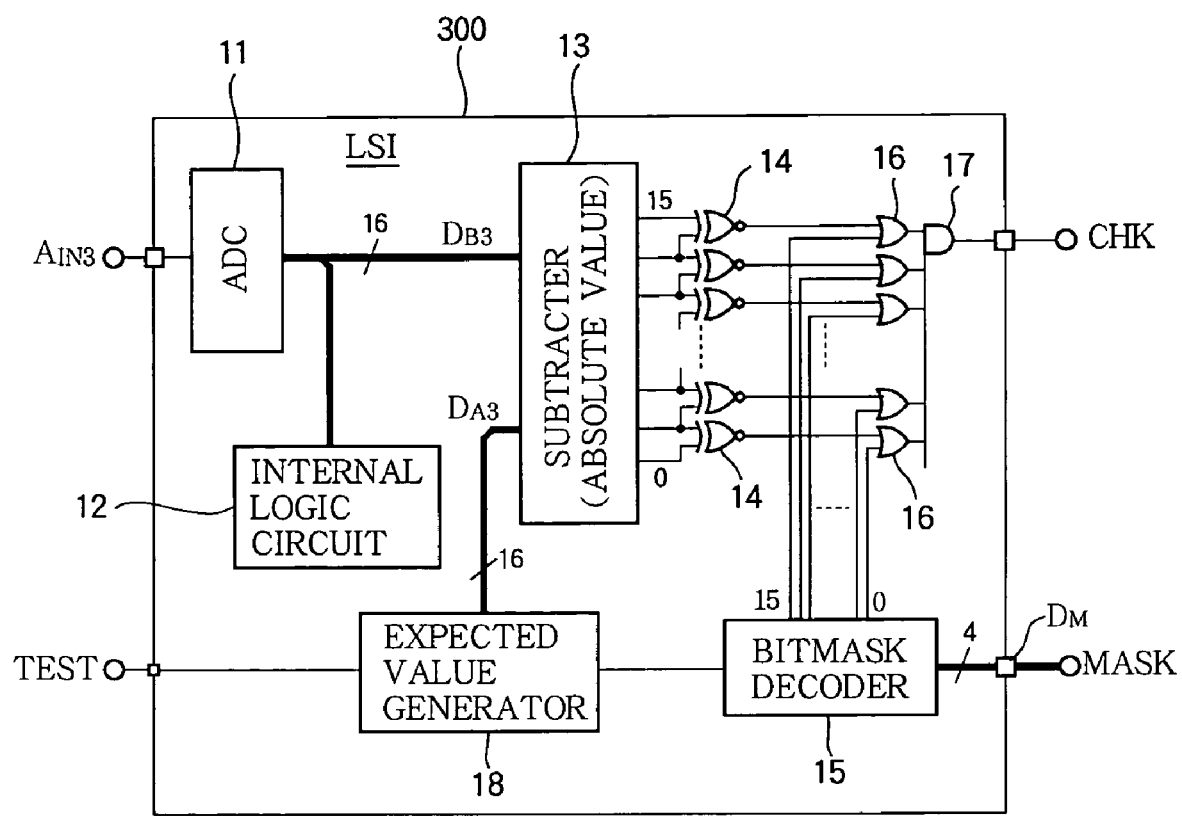
FIG. 5 is a block diagram showing an LSI circuit including a testing circuit according to the third embodiment of the present invention (i.e., a testing circuit which can perform a testing method according to the third embodiment)

FIG. 5 is a block diagram showing an LSI circuit 300 which includes a testing circuit according to the third embodiment (i.e., a circuit which can perform a testing method according to the third embodiment). In FIG. 5, the same reference symbols denote the same or corresponding elements in FIG. 3.

The testing circuit according to the third embodiment differs from that of the second embodiment in the point that the testing circuit according to the third embodiment includes an internal expected value generator 18 and a TEST terminal as a substitute for the EXPECT terminal in the first or second embodiment.

When the TEST terminal is HIGH level, the expected value generator 18, in which a code corresponding to an analog input voltage $A_{IN3}$ is stored in advance, outputs an expected value $D_{A3}$ having a plurality of bits (e.g., 16 bits)

to a subtracter 13 at the same intervals as the AD-conversion by an ADC 11, to which a predetermined signal $A_{IN3}$ is supplied.

Figure 6:
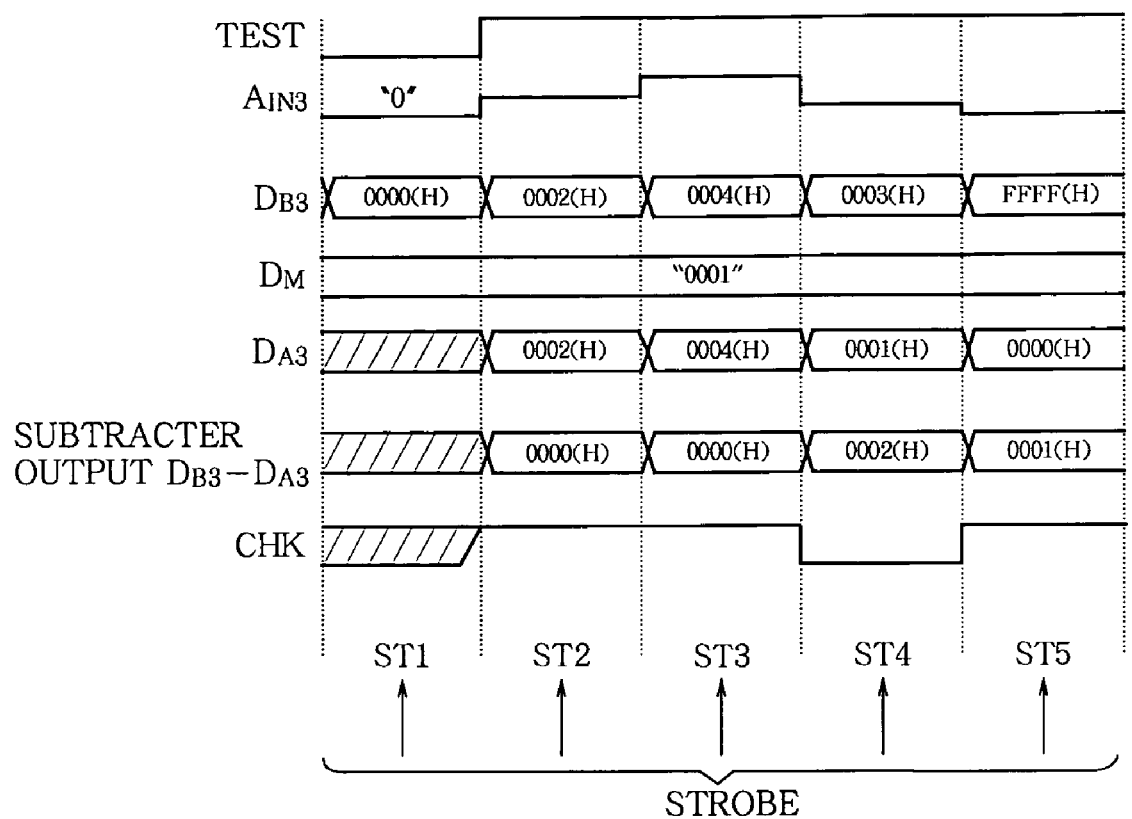
FIG. 6 is a timing chart for explaining operation in the testing circuit according to the third embodiment (i.e., the testing method according to the third embodiment)

FIG. 6 is a timing chart for explaining operation of the testing circuit according to the third embodiment (i.e., the testing method according to the second embodiment). In FIG. 6, Strobes ST1 to ST5 indicate timings of monitoring an AD-converted signal (i.e., a converted value outputted from the ADC 11).

First, an analog input signal $A_{IN3}$, which is a predetermined voltage shown in FIG. 6, is inputted to the ADC 11. Here, operation will be described with reference to a case where the analog input signal $A_{IN3}$ is inputted to the ADC 11 so that the expected values $D_{A3}$ are 0002(H) 0004(H), 0001(H), and 0000(H), and the converted values $D_{B3}$ after the AD-conversion by the ADC 11 are 0002(H), 004(H), 0003(H), and FFFF(H). A conversion error of 1-LSB are permitted in the ADC 11 by the specification, a MASK terminal is set to "0001", and an LSB in the outputs of a plurality of OR gates 16 are fixed to HIGH level.

Next, when the TEST terminal is HIGH level, the expected value generator 18 outputs 0002(H), 0004(H), 0001(H), and 0000(H) in synchronization with the AD-conversion cycles. At that time, the subtracter 13 outputs 0000(H), 0000(H), 0002(H), and 0001(H), and a CHK terminal outputs HIGH, HIGH, LOW, and HIGH levels. When the CHK terminal outputs HIGH level, it is determined as a pass result and when the CHK terminal outputs LOW level, it is determined as a fail result. Accordingly, the converted values 0002(H), 0004(H), and FFFF(H) which have an error within 1-LSB are determined as pass results and the converted value 0003(H) which has a 2-LSB error is determined as fail result.

As has been described above, according to the testing circuit or the testing method according to the third embodiment in which the expected value $D_{A3}$ is generated in an internal circuit, i.e., the expected value generator circuit, the number of test terminals can be reduced and a simple test program, in which the TEST terminal is set to be HIGH level and HIGH level of the CHK terminal is monitored, can be used.

The third embodiment is the same as the second embodiment except for the points described above.

Fourth Embodiment

Figure 7:
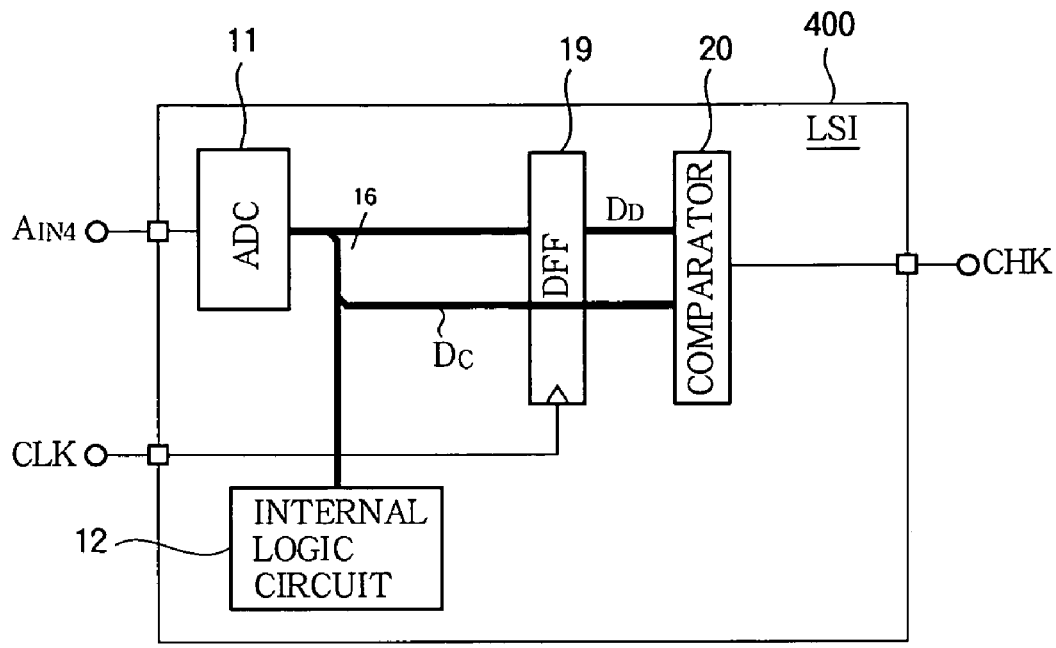
FIG. 7 is a block diagram showing an LSI circuit including a testing circuit according to the fourth embodiment of the present invention (i.e., a testing circuit which can perform a testing method according to the fourth embodiment)

FIG. 7 is a block diagram showing an LSI circuit 400 which includes a testing circuit according to the fourth embodiment of the present invention (i.e., a circuit which can perform a testing method according to the fourth embodiment). In FIG. 7, the same reference symbols denote the same or corresponding elements in FIG. 1.

As shown in FIG. 7, the LSI circuit 400 includes an ADC 11 which converts an analog input signal $A_{IN4}$ into a digital signal (i.e., a converted value) $D_C$ having a plurality of bits, and an internal logic circuit 12 which operates according to the converted value $D_C$ outputted from the ADC 11. The LSI circuit 400 also includes a delay flip-flop (DFF) circuit 19 which delays the converted value $D_C$ outputted from the ADC 11 and output a delayed converted value $D_D$ having a plurality of bits. The LSI circuit 400 further includes a comparator 20 which compares the delayed converted value $D_D$ outputted from the DFF circuit 19 and the current converted value $D_C$ outputted from the ADC 11. A clock input of the DFF circuit 19 is connected to a CLK terminal and an output of the comparator 20 is connected to a CHK terminal. The comparator 20 outputs HIGH level when the converted value $D_C$ is greater than the delayed converted value $D_D$, and outputs LOW level when the converted value $D_C$ is not greater than the delayed converted value $D_D$. Although FIG. 7 shows that the elements 11, 12, 19, and 20 form an LSI circuit 400, the DFF 19 and the comparator 20 forming the testing circuit can be an external device which is separated from the LSI circuit including the ADC 11 and the internal logic circuit 12.

Figure 8:
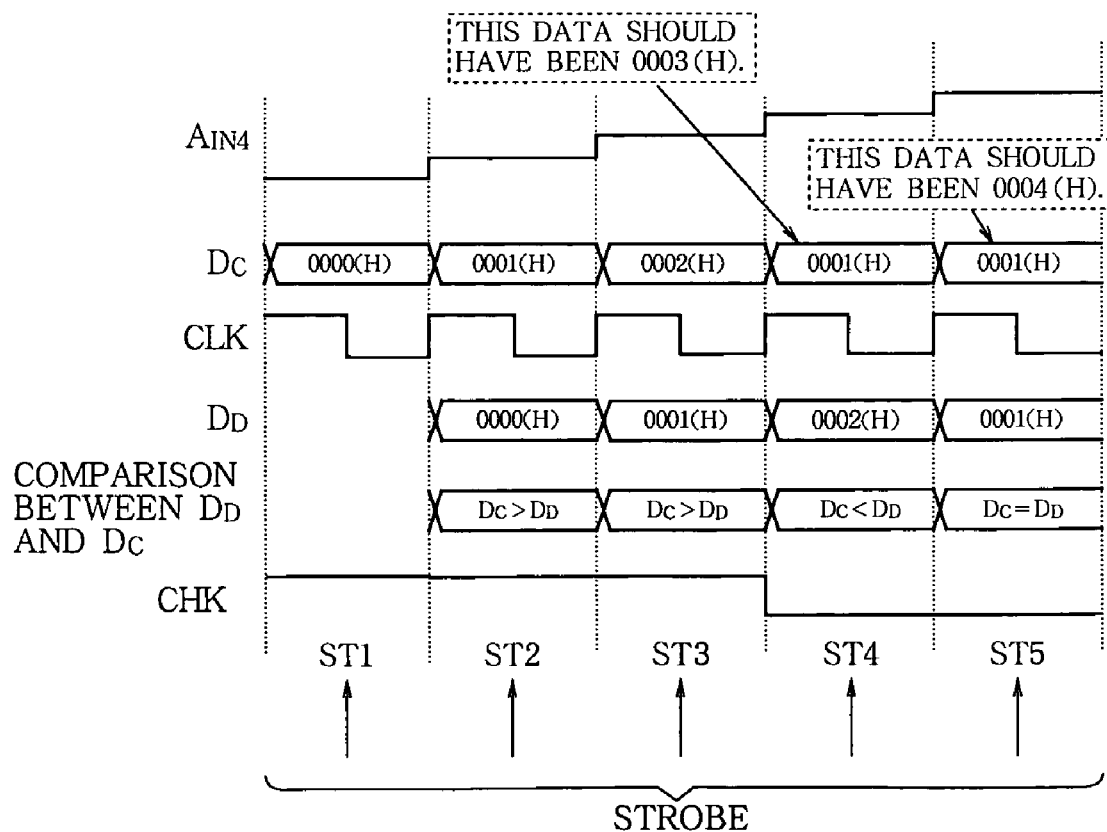
FIG. 8 is a timing chart for explaining operation in the testing circuit according to the fourth embodiment (i.e., the testing method according to the fourth embodiment)
Figure 9:
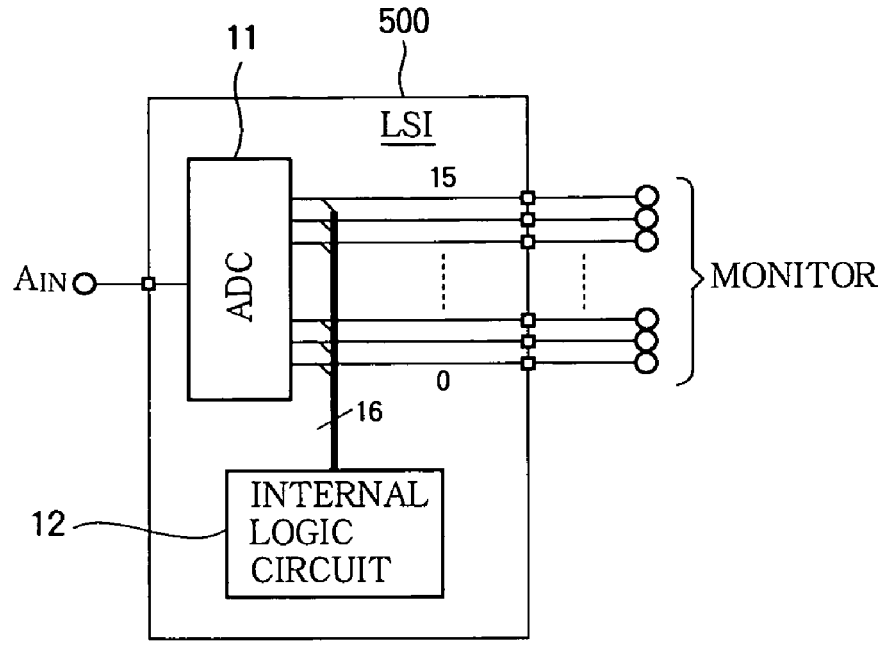
FIG. 9 is a diagram for explaining a conventional testing method for an ADC.
Figure 10:
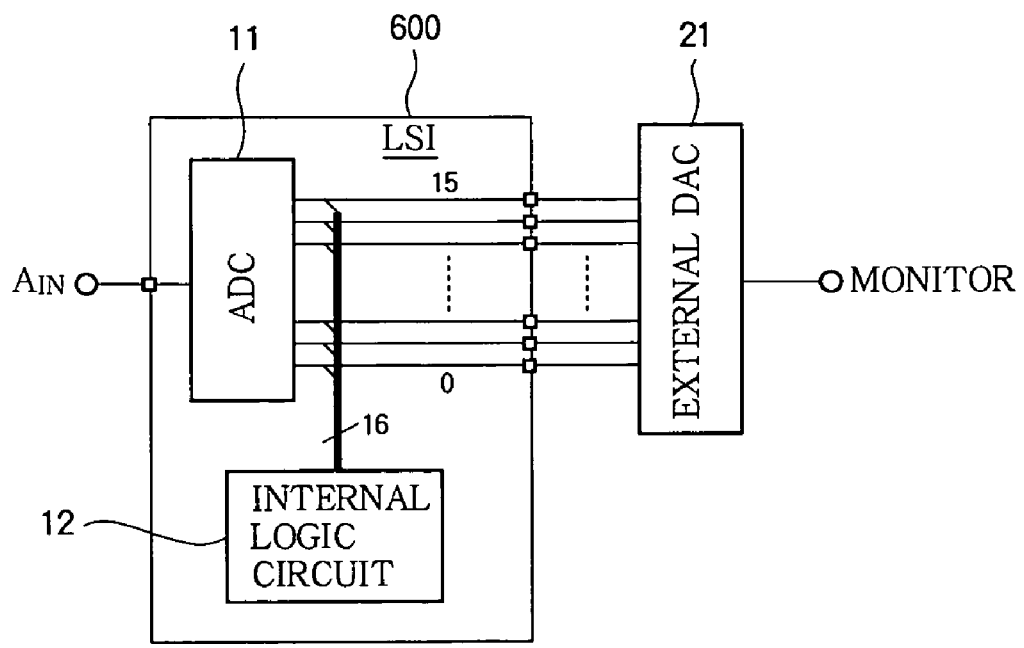
FIG. 10 is a diagram for explaining another conventional testing method for an ADC.

FIG. 8 is a timing chart for explaining operation in a testing circuit according to the fourth embodiment (i.e., a testing method according to the fourth embodiment). In FIG. 8, Strobes ST1 to ST5 denote timings of monitoring an AD-converted signal (i.e., a converted value outputted from the ADC 11).

An analog input voltage $A_{IN4}$ which is a predetermined voltage shown in FIG. 8 is inputted to the ADC 11. Here, operation will be described with reference to a case where the analog input voltage $A_{IN4}$ is inputted to the ADC 11 so as to obtain values after the AD-conversion 0000(H), 0001 (H), 0002(H), 0001(H), and 0001(H) and one-cycle delayed signals $D_D$, 0000(H), 0001(H), 0002(H), 0001(H), and 0001 (H). The analog input voltage $A_{IN4}$ may takes on values increasing step by step within the AD-conversion period, from the minimum value of an input range to the maximum value.

At the comparator 20, the converted value after the AD-conversion is compared. As a result of the comparison between a current data (converted value) $D_C$ having a plurality of bits and the one-cycle preceding data (delayed converted value) $D_D$ having a plurality of bits, if the current converted value $D_C$ is grater than the one-cycle preceding data $D_D$ (i.e., if $D_C > D_D$), the comparator 20 supplies the CHK terminal with HIGH level, as the Strobes ST2 and ST3 in FIG. 8 show. If current converted value $D_C$ is not greater than the one-cycle preceding converted value $D_D$, the comparator 20 outputs LOW level to the CHK terminal, as the Strobes ST4 and ST5 in FIG. 8 show.

As has been described above, according to the testing circuit or the testing method according to the fourth embodiment in which pass/fail decision is made by a comparison of the previous and the current data, the pass/fail decision can be performed regardless of whether or not outputs of the ADC 11 are around zero-crossing and can be performed by less number of circuit elements. For this reason, the testing circuit or the testing method according to the fourth embodiment is suitable for a simple test (i.e., a test for which high accuracy is not required).

The fourth embodiment is the same as the first embodiment except for the points described above.

MODIFIED EXAMPLES

Although the subtracter 13 calculates the absolute value of the difference in the first to third embodiments, the calculation of the absolute value are not necessarily required for some data forms.

Although the parallel data transmission is used in the LSI circuits 100, 200, and 300 of the first to third embodiments, the serial data transmission can be used in the LSI circuits of the first to third embodiments as a substitute for the parallel data transmission.

Although the testing circuits in the first to third embodiments includes the ENOR gates 14, the OR gates 16 or the AND gate 17, these gates can be replaced by other circuits which can perform the same processing.

Although the testing circuit in the LSI circuit 400 of the fourth embodiment checks the ADC 11 while the input signal to the ADC 11 increases step by step, the testing circuit can check the ADC 11 while the input signal to the ADC 11 decreases step by step.

In the first to fourth embodiments, although the 16-bit ADC is used, the any bit number can be adopted by the ADC 11.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A circuit for testing an analog-digital converter, comprising:
    a subtracter which receives a converted value having a plurality of bits outputted from the analog-digital converter and an expected value having a plurality of bits, the subtracter calculating a difference value having a plurality of bits between the converted value and the expected value; and
    a logical operation circuit which receives the difference value, the logical operation circuit performing an exclusive-NOR operation between adjacent bits in the plurality of bits constituting the difference value, thereby outputting an exclusive-NOR value having a plurality of bits.

2. The circuit according to claim 1, further comprising:
    a logical sum circuit which receives the exclusive-NOR value outputted from the logical operation circuit and a predetermined mask value having a plurality of bits, the logical sum circuit performing a logical sum operation between the exclusive-NOR value and the predetermined mask value, thereby outputting a logical sum value having a plurality of bits; and
    a logical product circuit which receives the logical sum value, the logical product circuit performing a logical product operation of the plurality of bits constituting the logical sum value.

3. The circuit according to claim 1, wherein the expected value is inputted to the subtracter from outside.

4. The circuit according to claim 1, further comprising an expected value generator which generates the expected value.

5. The circuit according to claim 2, further comprising a bitmask decoder which generates the predetermined mask value.

6. The circuit according to claim 1, wherein the logical operation circuit includes a plurality of exclusive-NOR gates.

7. The circuit according to claim 2, wherein the logical sum circuit includes a plurality of OR gates.

8. The circuit according to claim 1, further comprising the analog-digital converter to be tested.

9. A method for testing an analog-digital converter, comprising the steps of:
    inputting an analog input signal to the analog-digital converter, thereby causing the analog-digital converter to output a converted value having a plurality of bits;
    calculating a difference value having a plurality of bits between the converted value outputted from the analog-digital converter and an expected value having a plurality of bits; and
    performing an exclusive-NOR operation between adjacent bits in the plurality of bits constituting the difference value, thereby outputting an exclusive-NOR value having a plurality of bits.

10. The method according to claim 9, further comprising the steps of:
    performing a logical sum operation between the exclusive-NOR value and a predetermined mask value having a plurality of bits, thereby outputting a logical sum value having a plurality of bits; and
    performing a logical product operation of the plurality of bits constituting the logical sum value.

11. The method according to claim 9, wherein the analog input signal inputted to the analog-digital converter is constant.

12. The method according to claim 9, wherein the analog input signal inputted to the analog-digital converter increases or decreases step by step.

* * * * *